United States Patent [19]

Mitsui

[11] Patent Number: 5,523,678
[45] Date of Patent: Jun. 4, 1996

[54] CONTACT MECHANISM FOR TRANSPORTATION COMPRISING SUCTION UNIT EQUIPPED WITH FLOATING MECHANISM

[75] Inventor: Osamu Mitsui, Tokyo, Japan

[73] Assignee: Ando Electric Co., Ltd., Tokyo, Japan

[21] Appl. No.: 389,715

[22] Filed: Feb. 15, 1995

[30] Foreign Application Priority Data

Feb. 28, 1994 [JP] Japan .................................. 6-054585

[51] Int. Cl.⁶ ............................................... G01R 31/02
[52] U.S. Cl. ......................................... 324/158.1; 324/754
[58] Field of Search .................................. 324/158.1, 73.1, 324/764, 765, 755, 754; 414/416, 788, 789, 422; 209/573

[56] References Cited

U.S. PATENT DOCUMENTS

| | | | |
|---|---|---|---|
| 3,039,604 | 6/1962 | Bickel et al. | 209/573 |
| 4,593,820 | 6/1986 | Antonie et al. | 209/573 |
| 4,997,552 | 3/1991 | Schlinkmann et al. | 209/552 |
| 5,177,434 | 1/1993 | Suzuki et al. | 324/755 |
| 5,313,156 | 5/1994 | Klug et al. | 414/416 |

FOREIGN PATENT DOCUMENTS 2-187677  7/1990  Japan .

*Primary Examiner*—Vinh P. Nguyen
*Attorney, Agent, or Firm*—Flynn, Thiel, Boutell & Tanis

[57] ABSTRACT

A suction unit for an IC component transport assembly. The suction unit includes a support block that is fixedly attached to the moving element of the transport assembly. The suction unit further includes a swinging block and a floating block to allow the suction unit to both move pivotally and from side-to-side relative to the moving block. A presser block is attached to the floating block and is provided with a suction pad for holding the IC component. The presser block includes outwardly and downwardly extending guide pins. Posts located adjacent the IC socket are adapted to receive the presser block guide pins. As the suction unit is moved downward, the guide pins are received in the guide posts to ensure that the IC will be accurately positioned and placed in the IC socket.

18 Claims, 6 Drawing Sheets

CONTACT MECHANISM FOR TRANSPORTATION COMPRISING SUCTION UNIT EQUIPPED WITH FLOATING MECHANISM

BACKGROUND OF THE INVENTION

1. Field of the Invention

The present invention relates to a contact and transportation mechanism comprising a suction unit equipped with a floating mechanism. The suction unit is employed by an autohandler for directly pressing an IC held thereby on an IC socket in order to measure IC of an high measuring frequency.

2. Description of the Related Art

A conventional structure of a contact and transportation mechanism and that; of a suction unit will be described hereinafter with reference to FIG. 5. FIG. 5 is a cross-sectional view of an autohandler connected to an IC tester in such a way as to cover the test head thereof. Denoted at 20 in FIG. 5 is a measuring substrate provided on the upper surface of the test head, and a plate-shaped adapter 20C is mounted on the measuring substrate 20. IC sockets 21A and 21B are arranged on the adapter 20C leaving a given space therebetween.

Denoted at 90 in FIG. 5 is a substrate serving as a basis for the measuring portion of the autohandler, and a floating substrate 9 is provided on the substrate 90. The floating substrate 9 is freely movable on the substrate 90 since the former is placed on the latter by way of bearings 9B. A U-shaped casing 91 is attached to the lower surface of the central portion of the floating substrate 9 in such a manner as to project therefrom. Guide substrates 92A and 92B are attached to the lower surface of the casing 91.

Stepped holes 92C and 92D are formed in the guide substrates 92A and 92B respectively, and the stepped holes 92C and 92D are arranged on the casing 91 leaving the same space therebetween as that between the IC sockets 21A and 21B. In FIG. 5, the stepped portions of the stepped holes 92C and 92D are guided by the outline of the IC socket 21A so that the positional relationship between the measuring substrate 20 and the floating substrate 9 can be determined.

A through hole through which the mounting screw portion of a clamp lever 9A is inserted is formed at a peripheral portion of the floating substrate 9, the internal diameter of the through hole being sufficiently larger than the outer diameter of the mounting screw portion. As a result, the floating substrate 9 is fixed to the substrate 90 by the clamp lever 9A after the positional relationship therebetween is determined. In this way the autohandler is connected to the test head.

A horizontally moving substrate 10F is placed on the floating substrate 9 to be coupled thereto by way of a linear guide. A base 10G is mounted on the horizontally moving substrate 10F, and a holding block 10H is movably held by the base 10G. When a cylinder 10J is actuated, the holding block 10H moves vertically. Suction units 10A and 10B are attached to the holding block 10H leaving the same space therebetween as that between the stepped holes 92C and 92D.

Each of the function units 10A and 10B comprises a suction pad embedded therein at the lower portion thereof for retaining an IC thereon by suction. When the cylinder 10J lowers the suction units 10A and 10B from the state illustrated in FIG. 5, the presser portions 10C and 110D press the leads of the ICs on the contacts of the IC sockets 21A and 21B.

Then, the operation of the autohandler illustrated in FIG. 5 will be described hereinafter with reference to FIG. 6. FIG. 6 is a plan view of the autohandler in FIG. 5 viewed from above schematically showing the feeding mechanism thereof. Denoted at 60 in FIG. 6 is a feeding stage placed on the floating substrate 9, and 70 is an accommodating stage placed on the substrate 90. Recesses 61A and 61B for guiding the ICs in posture are formed on the feeding stage 60. Recesses 71A and 71B for guiding the ICs in posture are formed on the accommodating stage 70. The distance between the centers of the recesses 61A and 61B and that between the centers of the recesses 71A and 71B are set to be the same as that between the centers of the IC sockets 21A and 21B.

In FIG. 6, ICs are fed to the recesses 61A and 61B by an autohandler, not shown. Then the suction units 10A and 10B move onto the feeding stage 60 to retain the ICs thereon by suction. Thereafter the suction units 10A and 10B move onto the IC sockets 21A and 21B to press the ICs thereon for measurement. After the measurement, the suction units 10A and 10B release the ICs to go away leaving the same behind. The ICs left on the IC sockets 21A and 21B are transported to the recesses 71A and 71B by another autohandler.

The suction units and the contact and transportation mechanism illustrated in FIGS. 5 and 6 are suited to measuring ICs of high measuring frequency since the ICs held by the suction units are directly pressed on the IC sockets. However, coupling or transportation is difficult to the conventional contact mechanism in case of ICs comprising leads which are arranged extremely close to one another and are fragile being narrow in width such as a recent QFP type IC.

Particularly in case of an autohandler for measuring two ICs arranged in parallel as illustrated in FIG. 6, it is required to couple the autohandler to the test head while accurately conforming the interval between the centers of the cylinders to that of the two IC sockets or accurately transport the two ICs in the autohandler. The structure illustrated in FIG. 5 has a limit in improving assembling accuracy or parts accuracy, and moreover has a problem that it takes a long time for coupling.

SUMMARY OF THE INVENTION

It is the object of the present invention to provide a contact and transportation mechanism comprising a suction unit equipped with a floating mechanism, the contact mechanism being easily coupled to the test head by providing a presser block held in the suction unit in such a way as to in a floating state therein, forming guide pins on the presser block, and forming guides on the IC sockets for being positioned by the guide pins.

In order to attain the above object, in a connecting mechanism comprising a suction unit equipped with a floating mechanism according to a first aspect of the invention wherein a suction unit transports an IC 11 and presses the same on an IC socket 21 while an autohandler is coupled to a test head which comprises IC sockets on the upper surface thereof in such a way as to cover the same, the suction unit being composed of a supporting block 1, a swinging block 2, a floating block 3, a coupling block 4 and a presser block 5, wherein the swinging block 2 is coupled to the lower surface of the supporting block i to be a little swingable, the floating block 3 is suspended from the swinging block 2 to be in a little floating state, the coupling block 4 is fixed to the floating block 3, the presser block 5 is detachably held by the coupling block 4, a suction pad 5A for retaining the IC 11 thereon by suction or releasing the same therefrom is provided at the central portion of the lower surface of the presser block 5, a presser foot 5B which contacts with the leads of the IC 11 at the lower surface thereof is provided around the suction pad 5A, at least two guide pins 5C project downward being bracketed off the side surface of the presser block 5;, guides 22 comprising holes 22A for receiving the guide pins 5C therein are provided around the IC socket 21 and an elevating means 31 lowers the suction unit to press the IC 11 on the IC socket 21.

According to a second aspect of the invention, a heat-conductive block 4A which is heated by a heater 6A is provided inside the coupling block 4, the peripheral and upper walls of the coupling block 4 and the heat-conductive block 4A are supported by a heat-insulating block 4B to be thermally insulated from each other, a heat-conductive block 5D is held inside the presser foot 5B in such a way as to be thermally insulated from the suction pad 5A and the lower surface of the heat-conductive block 4A is in close contact with the upper surface of the heat-conductive block 5D and the lower surface of the heat-conductive block 5D is in close contact with the package of the IC 11 so as to be heated.

According to a third aspect of the invention, a plurality of suction units according to the first or second aspect of the invention are arranged in parallel for transporting a plurality of ICs 11.

In case of the structure according to the first aspect of the invention, the supporting block 1 and the swinging block 2 are rotatably coupled to each other by way of a coupling block 7 so that they swing a little around the x-axis or y-axis. Moreover, the supporting block I and the swinging block 2 are coupled to each other by a spring 8, which applies force to the swinging block 2 for returning the same to its original state when the swinging block 2 is displaced therefrom. Balls 2C which intervenes between the swinging block 2 and the floating block 3 reduces the coefficient of friction therebetween, the swinging block 2 and floating block 3 forming a lower pair. The floating block 3 is coupled to the swinging block 2 to in a floating state thereunder by way of stepped pins 2B. As described above, since the presser block 5 is held to in a floating state, when the suction unit lowers, the guide pins 5C come to fit the holes 22A of the guides 22 at the conically-shaped tip end portions thereof so that the leads of the IC 11 and the contact of the IC socket 21 are accurately positioned to be brought into contact with each other.

The second aspect of the invention adds a heating function to the suction unit equipped with floating mechanism according to the first aspect of the invention. Since the IC 11 is heated when the same is retained or is pressed on the IC socket 21 by the suction unit according to the second aspect of the invention, it is possible to perform a high temperature measurement with accuracy if the heater 6A is properly controlled in temperature. When the heater 6A is not used, the contact mechanism functions as an autohandler at the normal temperature according to the first aspect of the invention.

The third aspect of the invention employs two or more suction units of the first or second invention arranged in parallel to one another. The first aspect of the invention does not require accuracy in the interval between the suction units or IC sockets in assembling, since the suction units are individually positioned relative to their corresponding IC sockets.

DESCRIPTION OF THE PREFERRED EMBODIMENT

Figure 1A:
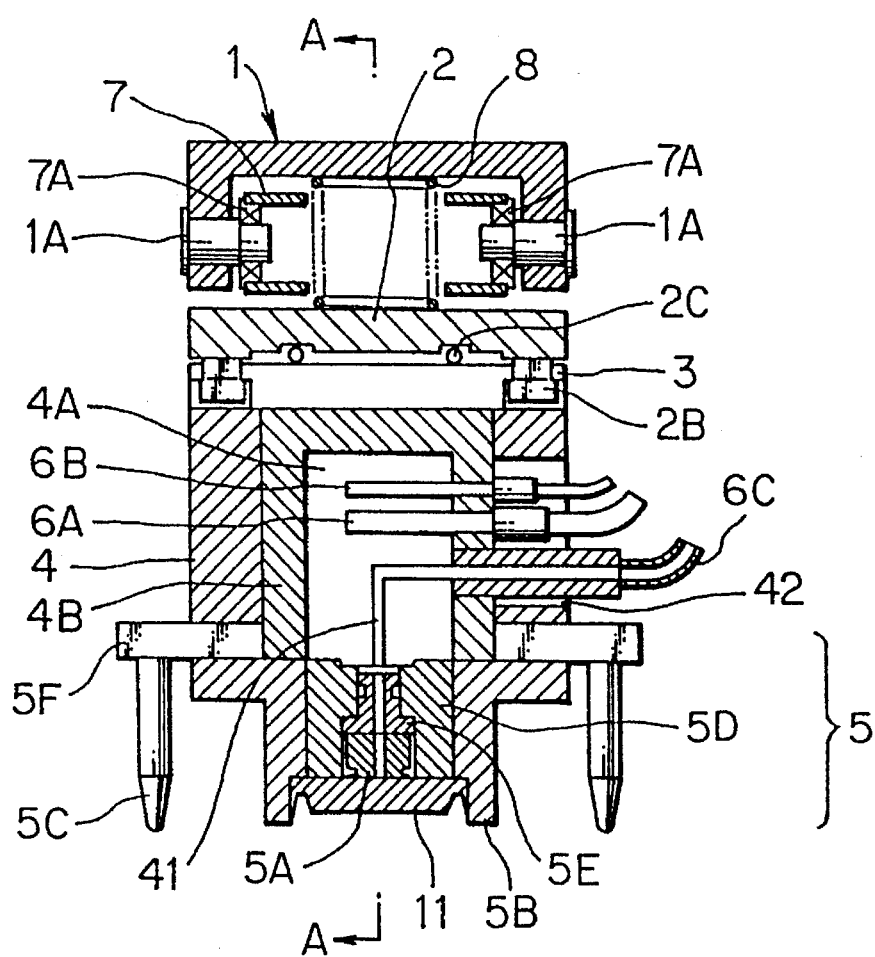
FIG. 1 (a) is a cross sectional view of the suction unit and FIG. 1 (b) is a across section view of the suction unit in FIG. 1 (a) taken along an arrow AA.
Figure 1B:
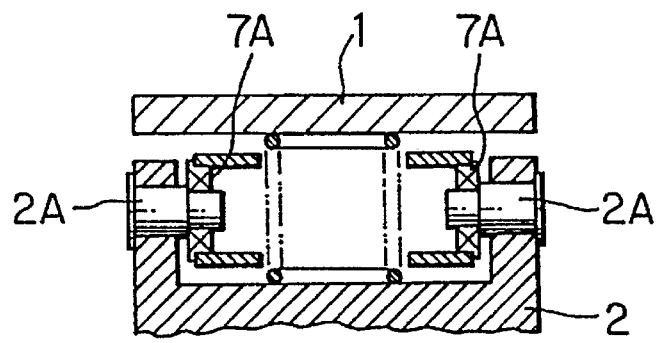

A structure of a suction unit according to a first embodiment of the invention will be described hereinafter with reference to FIG. 1 (a) and FIG. 1 (b). FIG. 1 (a) is a cross-sectional view of the suction unit and FIG. 1 (b) is a cross-sectional view of the suction unit in FIG. 1 (a) taken along an arrow AA. In FIG. 1, denoted at 1 is a supporting block, 2 is a swinging block, 3 is a floating block, 4 is a coupling block, 5 is a presser block, 7 is a coupling block, 8 is a spring and 11 is an IC.

In FIG. 1 (a), pins 1A are fixed to the confronting side walls of the supporting block 1 having an inverse-U-shaped cross section so as to confront with each other at the tip ends thereof inside the supporting block 1. The coupling block 7 is disposed inside the supporting block 1 and is rotatably coupled to the pins 1A by way of bearings 7A which are held by the coupling block 7 at the first side surfaces thereof.

In FIG. 1 (b), pins 2A are fixed to the confronting side walls of the swinging block 2 having a U-shaped cross section so as to confront with each other at the tip ends thereof inside the swinging block 2. The coupling block 7 is rotatably coupled to the pins 2A by way of the bearings 7A which are held by the coupling block 7 at the second side surfaces thereof, the common axis of the pins 1A being perpendicular to that of the pins 2A.

A through hole is formed at the central portion of the coupling block 7, and a compressed coil spring 8 is provided in the through hole for applying force to the supporting block 1 and the swinging block 2 to separate them from each other. That is, when the swinging block 2 is displaced from its home position, the spring 8 applies force to the swinging block 2 to return the same to its home position.

Stepped pins 2B are fixed to the corner portions of the bottom surface of the swinging block 2 and the floating block 3 is suspended by the stepped pins 2B at the stepped portions thereof so as to be in a little floating state. Balls 3C intervene between the swinging block 2 and the floating block 3 to reduce friction therebetween.

The coupling block 4 fixed to the floating block 3 is hollow. A heat-conductive block 4A which is heated by a heating unit 6A is provided inside the coupling block 4. The peripheral and upper walls of the coupling block 4 and the heat-conductive block 4A are supported by a heat-insulating block 4B thereby to be thermally insulated from each other.

Metallic material, preferably aluminum is used for the heat-conductive block 4A and heat insulating synthetic resin, for example, epoxy-glass material is used for the heat-insulating block 4B.

A channel 41 which is coupled to the suction hole of a suction pad 5A, described later, is formed in the heat-conductive block 4A. A tube 6C is coupled to the channel 41 by way of a coupler at one end thereof and to a vacuum pump or the like at the other end thereof. The IC 11 is retained by suction on the suction pad 5A by generating negative pressure in the channel 41. A temperature sensor 6B for detecting heating temperature is inserted into the heat-conductive block 4A. Provided on a side wall of the coupling block 4 is a window 42 through which the leads of the heater 6A, the leads of the temperature sensor 6B and the tube 6C extend.

The presser block 5 is composed of the suction pad 5A, the presser foot 5B, the guide pins 5C, the heat-conductive block 5D, a coupler 5E and an arm 5F. The presser block 5 integrally composed of the aforementioned parts is detachably attached to the coupling block 4. A different presser block 5 is attached to the coupling block 4 for an IC which has a different shape.

The suction pad 5A for retaining the IC 11 by suction thereon or releasing the same therefrom is provided at the central portion of the lower surface of the presser block 5. A presser foot 5B which contacts with the leads of the IC 11 at the lower surface thereof is provided around the suction pad 5A. Two guide pins 5C project downward being bracketed off the side surface of the presser block 5.

The suction pad 5A is held by the coupler 5E in such a way as to be thermally insulated from the heat-conductive block 5D. The heat-conductive block 5D is held inside the presser foot 5B, the lower surface of the heat-conductive block 4A and is in close contact with the upper surface of the heat-conductive block 5D and the lower surface of the upper surface of the heat-conductive block 5D is in close contact with the package of the IC 11 so as to heat same. A suction hole passes through the centers of the suction pad 5A and the coupler 5E to be coupled to the channel 41 for drawing the IC 11 by suction onto the suction pad 5A.

Figure 2:
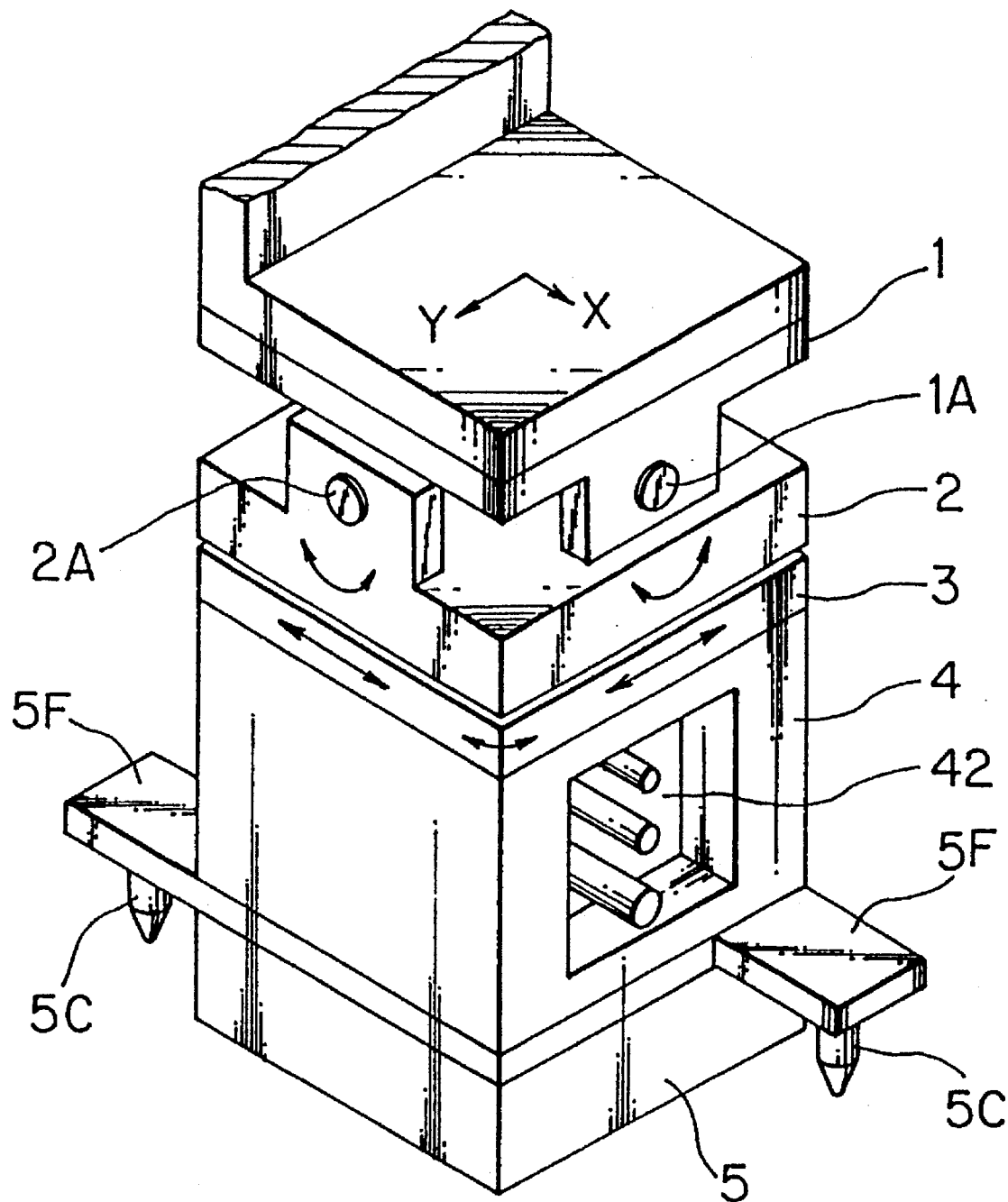
FIG. 2 is a view showing an external appearance of the suction unit in FIG. 1.

FIG. 2 is an exterior view of the suction unit in FIG. 1. As described with reference to FIG. 1, the supporting block 1 and the swinging block 2 are rotatably coupled to each other by way of a coupling block 7 so that they swing a little around the x-axis or y-axis. The floating block 3, the coupling block 4 and the presser block 5 move as a block in the x-direction or y-direction or rotate in the x-y plane.

Figure 3:
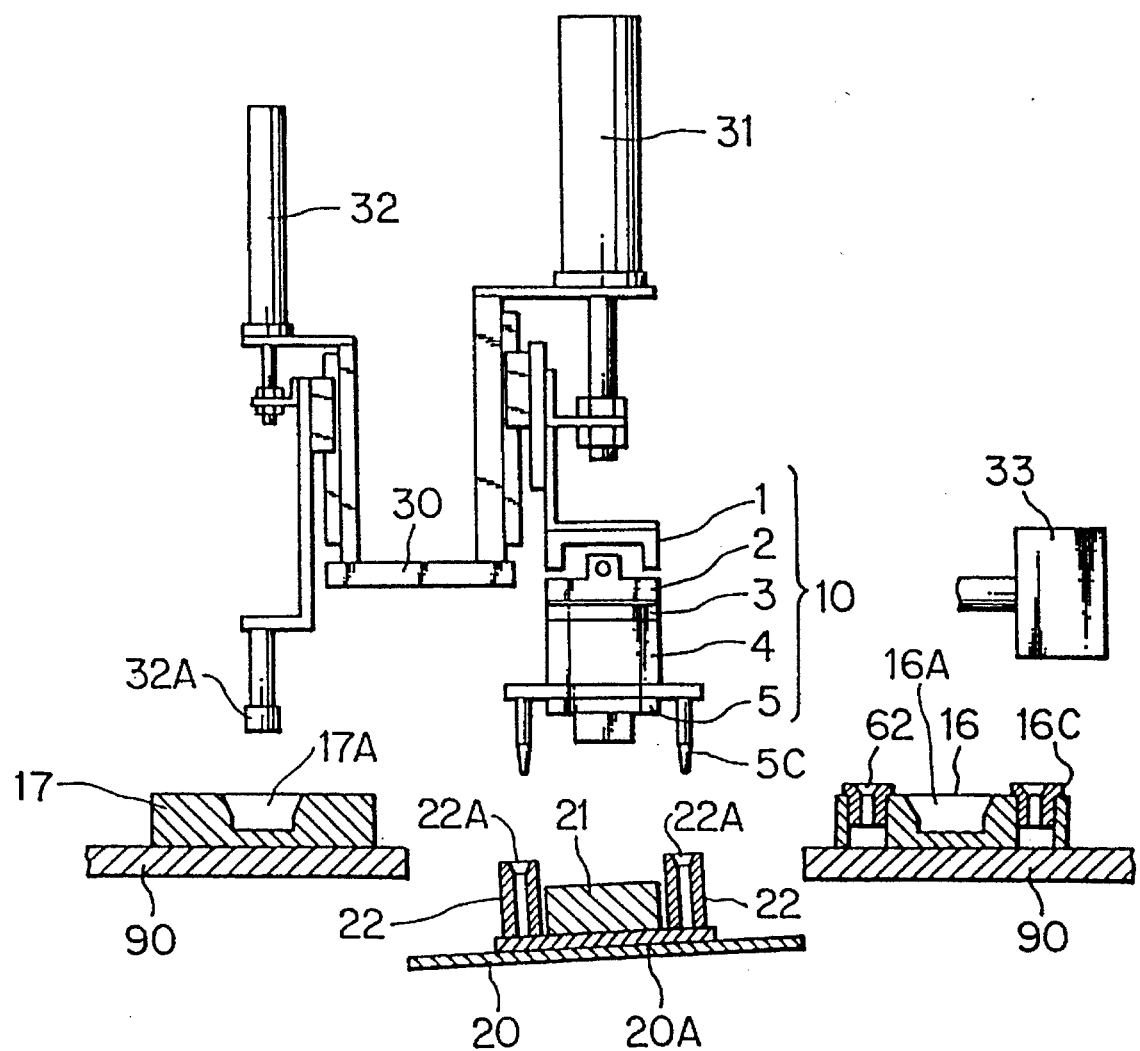
FIG. 3 is a contact mechanism which employs the suction unit in FIG. 1 according to a first embodiment of the invention.

A contact mechanism employing the suction unit in FIG. 1 according to a first embodiment of the invention will be described with reference to FIG. 3 hereinafter. In FIG. 3, a plate-shaped adapter 20A is mounted on the measuring substrate 20. The IC socket 21 is mounted on the adapter 20A and the guides 22 each having a hole 22A for receiving a guide pin 5C therein are arranged around the IC socket 21.

In FIG. 3, a feeding stage 16 and an accommodating stage 17 are placed on the substrate 90. A recess 16A for guiding the IC 11 in posture is formed in the feeding stage 16. Guides 16C each having a hole 62 for receiving a guide pin 5c therein are arranged around the recess 16a. A recess 17A for guiding the IC 11 in posture is formed in the accommodating stage 17.

Denoted at 30 in FIG. 3 is a moving block, to which a first elevating means of the cylinder 31 and a second elevating means of the cylinder 32 are attached. The cylinder 31 vertically moves a suction unit (referred to as a suction unit 10 hereinafter) according to the present invention while the cylinder 32 vertically moves a suction unit 32A. A motor 33 moves a moving block 30 horizontally. The moving block 30 moves the cylinders 31 and 32 and the suction units 10 and 32A en bloc.

The operation of the connecting mechanism illustrated in FIG. 3 will be described hereinafter. The suction unit 10 is moved onto the feeding stage 16. Then the cylinder 31 is actuated to make the suction unit 10 draw the IC 11 in the recess 16A thereto by suction. At that time, the presser block 5 holds the IC 11 while being accurately positioned by the guides 16C. Thereafter the suction unit 10 moves onto the IC socket 21 and lowers, when the presser block 5 presses the IC 11 on the IC socket 21 while being accurately positioned relative thereto by the guides 22. Upon completion of measuring the IC 11, the suction unit 10 moves toward the feeding stage 16 leaving the IC 11 in the IC socket 21. The IC 11 which remains in the IC socket 21 is transported to the recess 17A of the accommodating stage 17 by the suction unit 32A.

Figure 4:
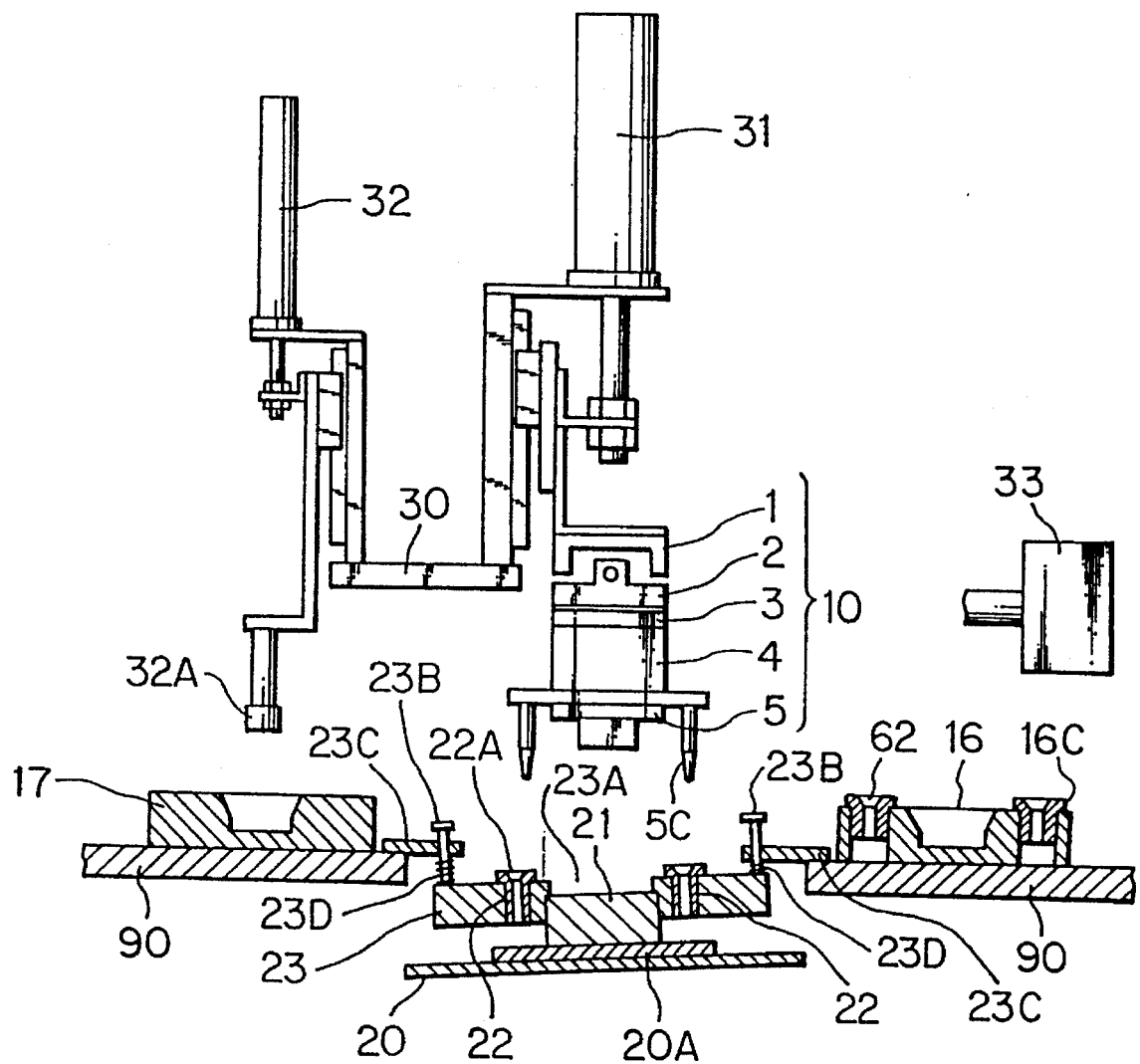
FIG. 4 is a contact mechanism which employs the suction unit in FIG. 1 according to a second embodiment of the invention.
Figure 5:
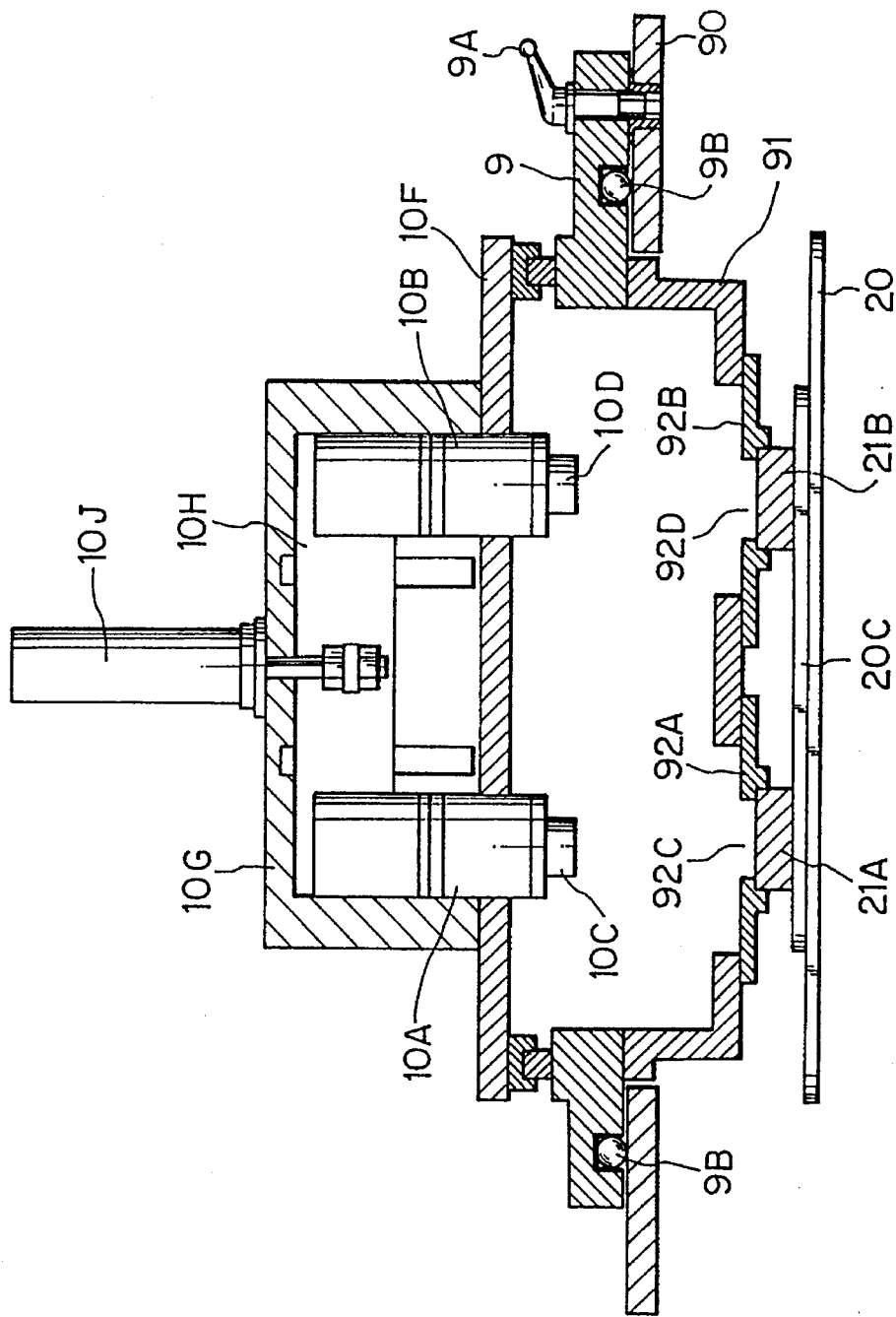
FIG. 5 is a view showing a structure of a contact and transportation mechanism comprising a suction unit of prior art.
Figure 6:
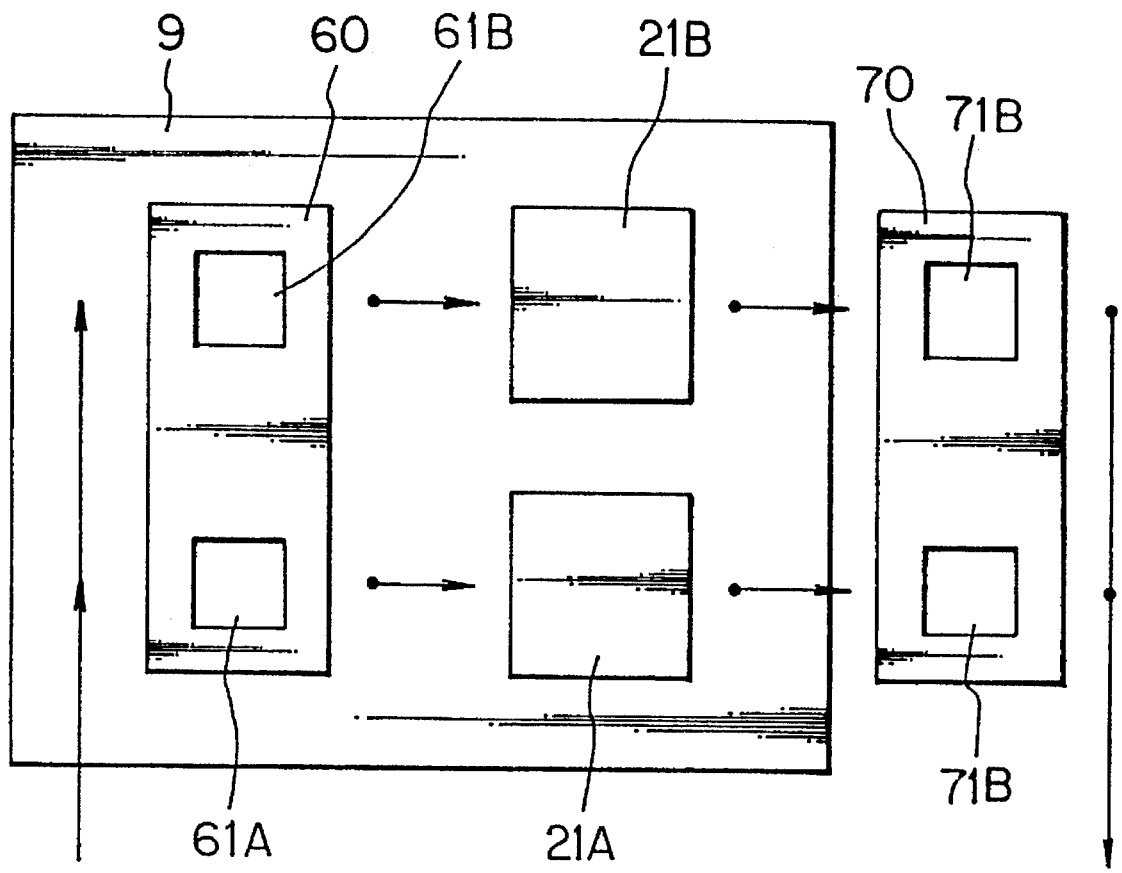
FIG. 6 is a plan of the contact and transportation mechanism in FIG. 5 viewed from above.

Then, a contact mechanism employing the suction unit in FIG. 1 according to a second embodiment of the invention will be described with reference to FIG. 4 hereinafter. Some test heads do not structurally allow a connecting mechanism for bringing the autohandler in contact with themselves to arrange the guides 22 on the measuring substrate 20 as illustrated in FIG. 3. FIG. 4 shows an embodiment which enables contact even in such a case.

Denoted at 23 in FIG. 4 is a guide substrate, and the other construction is the same as that illustrated in FIG. 3. A stepped hole 23A is formed in the guide substrate 23, which can restrain the position of the IC socket 21 since the stepped portion of the stepped hole 23A is formed a little larger than the external shape of the IC socket 21.

The guides 22 each having a hole 22A for receiving a guide pin 5C therein are arranged around the stepped hole 23A. Pins 23B are provided upright at the edge portion of the guide substrate 23. The pins 23B are coupled to coupling plates 23C which are provided on the substrate 90 of the measuring portion to extend over the opening thereof so that the guide substrate 23 is in a floating state. Compressed coil springs 23D are inserted between the guide substrate 23 and the coupling plate 23C around the pins 23B for applying force to them in the directions to which they are separated from each other.

In FIG. 4, it is possible to easily insert the IC socket 21 into the stepped hole 23A since the guide substrate 23 is elastically held to be in a floating state even if the measuring substrate 20 is inclined a little relative to the horizontal plane of the substrate 90. Moreover, the presser block 5 is in a floating state, so that the IC 11 is guided by the holes 22A to be brought into contact with the IC socket 21 with accuracy.

Although the contact mechanism illustrated in FIGS. 3 and 4 employs a single suction unit 10, it is possible to employ a plurality of suction units 10 in FIGS. 3 and 4 for measuring a plurality of ICs in parallel.

It is easy to couple the test head to the autohandler according to the invention since the suction unit is equipped with a presser block which is held by the suction unit to be in a floating state, guide pins are formed on the presser block and guides which are positioned by the guide pins are formed on the IC socket. Moreover, the suction unit comprises the suction pad and the presser block as one block according to the invention, so that it is possible to reduce the warp of leads of the IC when the same is pressed on the IC socket.

What is claimed is:

1. A transport assembly for positioning an integrated circuit (IC) component in an IC socket, the IC component having outwardly extending leads, said assembly comprising: p1 a moving block adapted to be selectively positioned over the IC socket and having a first drive unit with a member configured to be selectively lowered toward the IC socket;

a suction unit including:

a support block securely attached to said moving block first drive unit member;

a swinging block rotatably coupled to said support block so as to at least partially rotate around said support block;

a floating block coupled to said swinging block so as to move relative to said swinging block;

a presser block secured to said floating block so as to move with said floating block, said presser block having a base section that is directed toward the IC socket;

a suction pad secured to said presser-block base section, said suction pad being configured so that, when a suction force is applied thereto, an IC component will be held against said suction pad;

presser feet attached to said presser block so as to extend downwardly from said presser block base, said presser feet being positioned so that the IC component leads are located adjacent to said presser feet; and at least two guide pins that are attached to said presser block and that extend downwardly toward the IC socket; and at least two guide posts located adjacent the IC socket, said guide posts being configured to receive said guide pins and being positioned so that when said guide pins are positioned in said guide posts and said moving block member is actuated to lower said suction unit toward the IC socket, the IC component carried by said suction pad will seat in the IC socket.

2. The transport assembly of claim 1, further including a heating element secured to said suction unit for heating the IC component.

3. The transport assembly of claim 2, wherein a coupling block secured to said floating block, said presser block is secured to said floating block and said heating element is disposed inside said coupling block, said coupling block is provided with a thermally insulating member that surrounds said heating element and said presser block is provided with heat conducting material that is in thermal communication with said heating element and the IC component.

4. The transport assembly of claim 1, wherein at least two said suction units are attached to said moving block for seating a plurality of IC components.

5. The transport assembly of claim 4, further including at least one floating substrate to which the IC socket and said guide posts are mounted, said floating substrate being adjustably secured to a rigid, fixed substrate.

6. The transport assembly of claim 1, further including a coupling block secured to said floating block so as to move in unison with said floating block, wherein said presser block is connected to said coupling block so as to move in unison with said coupling block.

7. The transport assembly of claim 1, further including at least one floating substrate to which the IC socket and said guide posts are mounted, said floating substrate being adjustably secured to a rigid fixed substrate.

8. The transport assembly of claim 1, further including:

a second drive unit attached to said moving block having a member adapted to be selectively lowered towards the IC socket, wherein said first and second drive units are independently actuatable; and an auxiliary suction head coupled to said moving block second drive unit member, said auxiliary suction head being configured to receive a suction so that when the suction is applied thereto, an IC component will be held by said auxiliary suction head.

9. The transport assembly of claim 8, wherein a coupling block is secured to said floating block, said presser block is secured to said floating block so that coupling block and said presser block move in unison with said floating block, a heating element is disposed inside said coupling block, said coupling block is provided with a thermally insulating member that surrounds said heating element and said presser block is provided with heat conducting material that is in thermal communication with said heating element and the IC component.

10. A suction unit for an IC component transport mechanism for placing an IC in an IC socket, the suction unit being attachable to a moving transport unit that is selectively positionable over the IC socket, said suction unit comprising:

a support block for fixed attachment to the moving transport unit;

a swinging block rotatably coupled to said support block so as to at least partially rotate around said support block;

a floating block coupled to said swinging block so as to move relative to said swinging block;

a presser block secured to said floating block so as to move with said floating block, said presser block having a base section that is directed toward the IC socket;

a suction pad secured to said presser block base section, said suction pad being configured so that, when a suction force is applied thereto, an IC component will be held against said suction pad;

opposed presser feet attached to said presser block so as to extend downwardly from said presser block base, said presser feet being positioned so that leads that extend from the IC component are located adjacent to said presser feet; and at least two guide pins that are attached to said presser block and that extend downwardly toward the IC socket to guide the movement of the suction unit so that the IC component will seat in the IC socket.

11. The suction unit of claim 10, further including a coupling block secured to said floating block wherein said presser block is secured to said floating block so that said coupling block and said presser block move in unison with said floating block and a heating element disposed inside said coupling block, wherein said coupling block is provided with a thermally insulating member that surrounds said heating element and said presser block is provided with heat conducting material that is in thermal communication with said heating element and the IC component.

12. A transport assembly for positioning an integrated circuit (IC) component in an IC socket, the IC component having outwardly extending leads, said assembly comprising:

a moving block adapted to be selectively positioned over the IC socket and having a first drive unit with a member configured to be selectively lowered toward the IC socket;

a suction unit including: a plate securely attached to said moving block first drive unit member; a presser block coupled to said plate to partially swivel around said plate and to laterally shift position relative to said plate, said presser block having a base section that is directed toward the IC socket; and a suction pad secured to said presser block base section, said suction pad being configured so that, when a suction force is applied thereto, an IC component will be held against said suction pad; and a guide assembly at least partially attached to said suction unit for controlling the movement of said presser block relative to said plate so that as said suction unit is lowered over the socket, the IC component will be fitted in the IC socket.

13. The transport assembly of claim 12, wherein said suction unit includes a first coupling mechanism that allows said presser block to swivel relative to said plate and a second coupling mechanism that allows said presser block to laterally shift position relative said plate.

14. The transport assembly of claim 13, wherein said first and second coupling mechanisms operate independently of each other.

15. The transport assembly of claim 12, further including at least one presser foot that extends downwardly from said presser block base, said at least one presser block foot being positioned so that the IC component leads are located adjacent to said presser foot.

16. The transport assembly of claim 12, wherein said guide assembly includes at least one guide post located adjacent the IC socket and a guide pin attached to said presser block and configured to be coupled to said guide post so as to orient said suction unit so that the IC component is positioned over the IC socket.

17. The transport assembly of claim 12, wherein said unit includes a heating element for heating the IC component.

18. The transport assembly of claim 17, further including a coupling block secured between said plate and said presser block to move in unison with said presser block relative to said plate, wherein said heating element is disposed in said coupling block, said coupling block is provided with a thermally insulating member that surrounds said heating element and said presser block is provided with heat conducting material that is in thermal communication with said heating element and the IC component.

* * * * *

UNITED STATES PATENT AND TRADEMARK OFFICE
CERTIFICATE OF CORRECTION

PATENT NO. : 5 523 678
DATED : June 4, 1996
INVENTOR(S) : Osamu Mitsui

It is certified that error appears in the above-indentified patent and that said Letters Patent is hereby corrected as shown below:

Column 7, line 5; delete "p1" and start a new paragraph with the words "a moving block".

Column 7, line 21; change "presser-block" to ---presser block---.

Signed and Sealed this

Thirty-first Day of December, 1996

*Attest:*

BRUCE LEHMAN

*Attesting Officer*   *Commissioner of Patents and Trademarks*